United States Patent [19]
Hagenauer et al.

[11] Patent Number: 5,181,209
[45] Date of Patent: Jan. 19, 1993

[54] METHOD FOR GENERALIZING THE VITERBI ALGORITHM AND DEVICES FOR EXECUTING THE METHOD

[75] Inventors: Joachim Hagenauer; Peter Höher, both of Seefeld, Fed. Rep. of Germany

[73] Assignee: Deutsche Forschungsanstalt Fur Luft- Und Raumfahrt E.V., Cologne, Fed. Rep. of Germany

[21] Appl. No.: 504,357

[22] Filed: Apr. 3, 1990

[30] Foreign Application Priority Data

Apr. 3, 1989 [DE] Fed. Rep. of Germany ........ 3910739

[51] Int. Cl.⁵ .............................................. G06F 11/10
[52] U.S. Cl. ...................................................... 371/43
[58] Field of Search ................................. 371/43, 44, 45

[56] References Cited

U.S. PATENT DOCUMENTS

| | | | |
|---|---|---|---|
| 4,015,238 | 3/1977 | Davis | 371/43 |
| 4,519,080 | 5/1985 | Snyder | 371/43 |
| 4,748,626 | 5/1988 | Wong | 371/30 |
| 4,761,784 | 8/1988 | Srinivasagopalan | 371/43 |
| 4,862,483 | 8/1989 | Clark | 371/43 X |
| 4,905,317 | 2/1990 | Suzuki | 371/43 X |
| 5,023,889 | 6/1991 | Divsalar | 371/43 X |

FOREIGN PATENT DOCUMENTS

| | | |
|---|---|---|
| 0133480 | 2/1985 | European Pat. Off. . |
| WO/8805571 | 7/1988 | PCT Int'l Appl. . |
| 2189669 | 10/1987 | United Kingdom . |
| 8805571 | 7/1988 | World Int. Prop. O. . |

OTHER PUBLICATIONS

Cheung, "Influence of Design on Performance of a Satellite Modem Transmitting Coded Psk Signals", IEEE Proceedings-I, vol. 156, Feb. 1989 pp. 87–99.
IEEE Transactions on Information Theory, "Optimal Decoding Linear Codes for Minimizing Symbol Error Rate", Bahl, L. R. et al., (Mar. 1974).
*Proceedings of the IEEE*, "The Viterbi Algorithm", G. D. Forney, Jr., (Mar. 1973), vol. 61, pp. 268–278.
IEEE Transactions on Information Theory, "On the Viterbi Decoding Algorithm".
Cheung, S.W. et al., "Influence of design on performance of a satellite modem transmitting coded PSK signals", *IEE Proceedings*, 136, Pt. 1, No. 1:87–99 (Feb. 1989).

Primary Examiner—Robert W. Beausoliel
Attorney, Agent, or Firm—Browdy and Neimark

[57] ABSTRACT

In a method for generalizing the conventional Viterbi algorithm, in which the transition costs are formed in a metric increment unit (TMU) and adding, comparing and selection are performed in a succeeding add-compare-select (ACS) unit, the difference costs from two arriving paths are calculated for each individual state, the reliability information at the beginning of each path being set to the highest value. Then the reliability value of the path with the least costs is updated at the points where the information points differ from the competing path, updating being performed in accordance with a table, and where the prior value of the reliability information and the difference costs are inserted into the table as the new input values. Then this new value is taken from the table and is stored, together with hard decisions, as path memory, where storage can be in the form of fixed or floating point values. Finally the analog value decision is read out from the point which, after a decision delay, is the result for the path with the lowest cost and where the hard decisions of the conventional Viterbi algorithm are the sign of the analog value decision. By means of the method according to the invention a Viterbi algorithm has been created at the output of which analog value decisions, i.e. soft decisions are supplied.

7 Claims, 2 Drawing Sheets

METHOD FOR GENERALIZING THE VITERBI ALGORITHM AND DEVICES FOR EXECUTING THE METHOD

BACKGROUND OF THE INVENTION

1. Field of the Invention

The invention relates to a method for generalizing the Viterbi algorithm and devices for executing the method. The Viterbi algorithm described by G. D. Forney in Proc. of the IEEE, vol. 61, No. 3, pp. 268 to 278, March 1973, has become a standard tool in communications receivers, by means of which various functions, such as demodulation, decoding, equalization, etc. are performed. In an increasing number of applications two Viterbi algorithms are being used in a concatenated way. Examples of this are coded modulation systems without bandwidth expansion, such as coded QAM (quadrature amplitude modulation) together with CPM (continuous phase modulation), in which Viterbi receivers replace classical modulation methods. With an additional outer coding system convolutional codes with Viterbi coding can be used in order to perform FEC (forward error correction) decoding. However, such a solution has two drawbacks: for one, the inner Viterbi algorithm creates bursts of errors during demodulation, to which the outer Viterbi algorithm is very sensitive, and for another, the inner Viterbi algorithm creates hard, i.e. binary decisions, so that the capability of the outer Viterbi algorithm to produce so-called soft decisions, i.e. analog decisions, cannot be utilized. The first drawback can be compensated by means of interleaving between the inner and outer Viterbi algorithms. In the second case soft decisions, i.e. reliability information together with the decisions of the inner Viterbi algorithms are desirable. This would improve the effectiveness of the outer Viterbi algorithm considerably.

Similar problems arise if convolutional codes for FEC coding are used in channels requiring equalization. This is the case, for example, in the proposed pan-European Mobile Radio System (GSM). In this case a Viterbi equalizer produces only hard decisions which result in a reduced performance of the outer Viterbi algorithm in which FEC decoding is performed.

A further possibility rests in the use of a Viterbi algorithm for decoding blocked or terminated convolutional codes. This is a convolutional code with memory $v$, terminated by $v$ known symbols. Often a source decoder requires reliability information regarding the correct coding of the entire frame or of parts which can be used for concealing or interpolation of the source signals. Up to now, when an inner Viterbi algorithm was used, the correct choice for the outer code was considered to be a Reed-Solomon (RS) code for its burst correction capability, because by means of this RS code the residual errors of the Viterbi algorithm could be reduced. However, the full capabilities of an RS decoder can only be realized if error and erasure decoding is used. The desired ML (maximum likelihood) decoding of RS codes is not yet available at this time. But erasure as well as RS decoding would require soft decisions of the first Viterbi algorithm which, at a certain threshold value become erasures. Even simple block codes, such as parity check codes, could be decoded much better with the aid of soft decisions.

The Viterbi algorithm was introduced in 1967 as a method for decoding convolutional codes (see A. J. Viterbi, IEEE Trans. Inform. Theory, Vol. IT-13, pp. 260–269, April 1967), and shortly thereafter it was possible to show that the algorithm was optimal in the ML (maximum likelihood) sense (see, for example, I. K. Okura in IEEE Trans. Inform. Theory, Vol. II-15, pp. 177–179, Jan. 1969).

2. The Prior Art

Attempts to reduce the bit error probability to channels with intersymbol interference lead to a receiver structure which is less attractive than the Viterbi algorithm. This algorithm therefore was generalized (see, for example, L. R. Bahl et al, IEEE Trans. Inform. Theory, Vol. IT-20, pp. 284–287, March 1974). It was shown that the algorithm is optimal in the sense of a MAP decision and provides for each bit the corresponding a-posteriori probability (APP). However, because of the greater complexity the number of applications is limited.

Numerous further attempts were made for deriving reliability information. However, no proposal is known to applicant in which the a-posteriori probabilities (APP) of the MAP detector or a soft decision are used on the basis of an augmented Viterbi algorithm in order to perform optimal outer soft decision decoding.

Although soft decisions are accepted by a Viterbi receiver, it only supplies hard decisions. The next receiver stage, however, would work better in many cases if soft decisions, i.e. analog values, could be derived for each symbol. However, there is no direct way to extract soft decisions for each individual symbol in the conventional Viterbi algorithm.

BRIEF DESCRIPTION OF THE INVENTION

It is therefore an object of the invention to develop a method and a device for generalizing a Viterbi algorithm in such a way that the Viterbi algorithm produces analog, i.e. soft decisions.

In accordance with the invention, in a method for generalizing the conventional Viterbi algorithm, in which the costs are formed in a transition metric unit (TMU) and adding, comparing and selection are performed in a succeeding add-compare-select (ACS) unit, the difference costs from two arriving paths are calculated for each individual state, the reliability information at the beginning of each path being set to the highest value. Then the reliability value of the path with the least costs is updated at the points where the information points differ from the competing path; updating is performed in accordance with a table, in which the prior value of the reliability information and the difference costs are arranged in the table as the new input values. This new value is then taken from the table and is stored, together with hard decisions, in the form of a so-called path memory; storage can be in the form of fixed or floating point values. Finally an analog value decision is read out from the point which, after a defined decision delay, is the result for the path with the lowest cost. The hard decisions of the conventional Viterbi algorithm are the signs of the analog value decision. In the method for a modification of the method of the invention for generalizing the Viterbi algorithm, the minimum from the old reliability information and—by the introduction of a factor $a$—normalized path difference costs is formed for updating the reliability information, and this new value is then stored as path memory.

In accordance with a preferred improvement of the method for generalizing or modifying the Viterbi algorithm, a path update unit is provided for path updating, by means of which in a defined area ($k - v$ to $k - \delta_p$ with $v \leq \delta_p \leq \delta_m$) the information bits of the two competing paths are checked for concurrence and, if non-concurrence is noted, the updating procedure is activated; in this connection k identifies a time index, $v$ a code memory and $\delta$ a dicinon delay.

In a preferred device for executing the method, there are provided, besides the known units required for executing the Viterbi algorithm, namely a metric increment unit (TMU) and an add-compare-select unit, additionally a path RAM as well as a path updating unit (PAU), where for path updating in an exactly defined area, namely in the area $k-v$ to $k-\delta_m$, the information bits of the two competing paths are checked for concurrence and, in case of non-concurrence, the updating process in the path RAM is activated.

In accordance with an advantageous improvement of the device of the invention, a device for nonstandardizing the updating of the reliability information is provided, where a factor ($\alpha$) is introduced, which makes a fixed point representation possible and avoids overflow at the same time. If it is desired or required to gain time, a separate path updating unit (PAU) is provided for each one of S states, where, on the basis of this parallel arrangement in view of the provision of only a single path updating unit (PAU), a gain in time of the value of the factor S is achieved.

It is also possible in accordance with a further advantageous design to provide for each time interval ($k-v$ to $k-\delta_p$) a separate path updating unit (PAU) where it is possible, because of this parallel design, to attain gains in time of the value of a factor, namely $v-\delta_p$, where $v$ again is the code memory and $\delta_p$ a dicinon delay.

Thus, by means of the present invention a conventional Viterbi receiver is augmented by a so-called soft deciding device, i.e. a device delivering analog decisions, i.e. soft decisions, which are always better than hard, i.e. binary decisions. However, the extent of what can be gained by this depends on the manner in which the next receiver stage operates. Minimally a value of 2 dB is attainable symptomatically, while the maximum gain may lie at more than 10 dB. Such a gain is impossible to attain in a classic Viterbi receiver.

The Viterbi algorithm (VA) with analog value decision (SD) can be used in all areas in which conventional Viterbi algorithms can also be used, namely as a decoder, an equalizer or a demodulator for coded modulation. In all these cases it is only required to exchange the metric increment unit, i.e. the so-called TMU, in a known manner. The same is true for applications for punctured codes or in use as a demodulator with reduced status number.

Therefore, in accordance with the invention it is possible to use MAP (maximum a posterior) or a Viterbi detector in a receiver chain. This could be a Viterbi equalizer, a Viterbi demodulator (for example for modulation processes of constant envelopes (CPM) or for trellis-coded modulation (TCM)), or a Viterbi decoder for an inner convolutional code. A second detector follows this device which could be a demodulator or decoder following the equalizer, a decoder following the demodulator, an outer decoder following an inner decoder, or a source decoder. The performance of the second device is improved in that, besides binary decisions, i.e. hard decisions, reliability information or analog value decisions, i.e. soft decisions, are available from the first stage.

It is further possible by means of the invention to improve all previously mentioned possibilities of use as well as other uses, such as adaptive Viterbi schemes; FEC (Forward Error Correction)/ARQ (Automatic Repeat Request) schemes, a Viterbi synchronization with the aid of the Viterbi algorithm (VA) in accordance with the invention with analog-value decision (SD) that is with the aid of a Soft Deciding Viterbi Algorithm (SDVA). This is a Viterbi algorithm which uses soft (or hard) decisions for calculating metrics, but also decides soft, i.e. analog, and thus not in a hard, i.e. binary form. A particularly advantageous way consists in providing, together with the decisions, reliability information, i.e. the probability of a correct decision or a logarithmic probability function.

The optimal way consists in calculating a-posteriori probabilities (APP) for the decision and to form an algorithm for making Maximum A-Posteriori (MAP) decisions. The SDV algorithm in accordance with the invention thus is completely different from the Viterbi algorithm, although it is only required to provide the latter with a small additional device in the form of a unit supplying analog value decisions, a so-called soft deciding unit.

DESCRIPTION OF THE DRAWINGS

The invention will be described in detail below by means of preferred embodiments.

DETAILED DESCRIPTION OF THE PREFERRED EMBODIMENT

Figure 1:
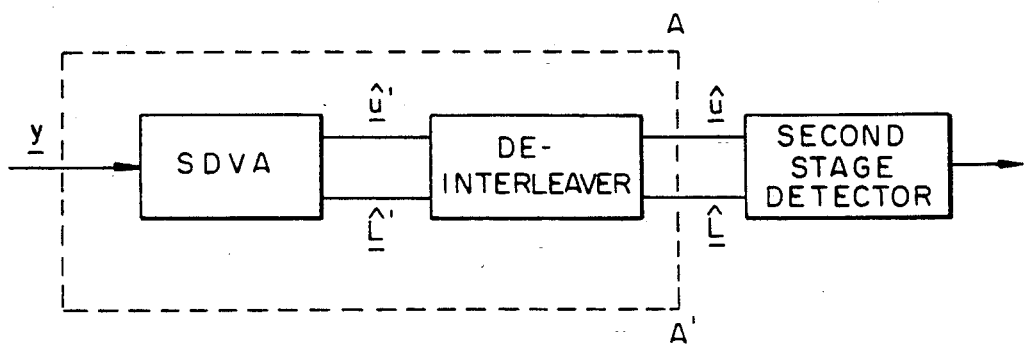
FIG. 1 is a block diagram of a detector for a Viterbi algorithm with analog value decisions and with reliability information in accordance with the invention.

In FIG. 1 a Viterbi detector of the first stage, by means of which a Viterbi algorithm with analog value decisions is performed, provides estimates u for the symbol sequence u' by processing the received symbol sequence y in a MAP or Viterbi detector. In the course of this the detector is to provide reliability information for each symbol, i.e. an estimated value for the probability that this symbol has been incorrectly detected:

$$p_k' = \text{Prob}\{\hat{u}_k' \neq u_k' | y\} \quad (1)$$

This estimated value $\hat{u}'$ is not always correct. Therefore a conditional probability density function $p(\hat{p}'_k p'_k)$ is provided, which describes the estimate error for estimating $\hat{p}'_k$, given by $p'_k$. Since the Viterbi algorithm of the first stage generates correlated errors in $\hat{u}'_k$ and $\hat{p}'_k$, which could degrade the performance of the next stage, sufficient interleaving is applied to attain statistical independence (the primes have been dropped). This, of course, requires a suitable interleaving device at the transmitter.

At the dashed line A—A' of FIG. 1 the detector of the first stage supplies symbols $\hat{u}_k$ with statistically independent error probabilities $\hat{p}_k$. Such a channel is called a discrete, memory-free compound channel, which supplies an estimated value $\hat{p}_k$ for these error probabilities $p_k$. If the error probability density $p(\hat{p}_k)$ and the estimate density $p(\hat{p}_k p_k)$ are given, the channel capacity of such a compound channel can be calculated. For binary values $u_k$, such a channel can be considered a binary, symmetrical channel (BSC) with an error probability $p_k$, which changes from bit to bit by a statistically independent value $p_k$ in accordance with the density function $p(p_k)$. This error probability can be assigned a probability of $p(\hat{p}_k p_k)$.

For a detector of the second stage the channel is a discrete (binary), memory-free compound channel with output pair values $(\hat{u}_k, \hat{p}_k)$. If the detector of the second page performs an ML (maximum likelihood) detection, the optimal ML metric is $$\sum_k x_k^{(m)} \cdot \hat{u}_k \log \frac{1 - \hat{p}_k}{\hat{p}_k}, \quad (2)$$

where $x_k^{(m)} = \pm 1$ is the k-th symbol of the m-th information sequence. The value $\hat{u}_k$ is the hard decision $(\pm 1)$ of the first Viterbi detector. Since this hard decision is to be weighed with $\log (1 - \hat{p}_k)$, $\hat{u}_k \log (1 - \hat{p}_k)/\hat{p}_k$ can be considered to be a soft decision variable. Accordingly, the first Viterbi algorithm is called a soft deciding Viterbi (SDV) algorithm, because it supplies soft decisions $$\hat{u}_k \log \frac{1 - \hat{p}_k}{\hat{p}_k} \quad (3)$$

which must be processed by the next ML detector stage. The detector of the next stage again may be a Viterbi algorithm which accepts soft decisions and finally supplies hard decisions. Usefully it again may be a soft deciding Viterbi (SDV) algorithm, which provides reliability information together with the decisions, which could be used in a decoder of the next stage or the source decoder. In the same way the soft decisions according to (3) could be quantized into three values $(-1, 0, \pm 1)$, which therefore indicate errors and erasures, which are usable in case the detector of the second stage is an RS or other block decoder. The Viterbi algorithm (VA) must then be modified so that it becomes a soft deciding Viterbi (SDV) algorithm supplying soft decisions (3) with $p_k$, which has been approximated as closely as possible to $p_k$. Two solutions are being investigated below:

In the first solution a device generates decisions having an optimal value of $\hat{p}_l = p_k$, or an optimal value for $\log(1 - \hat{p}_k) \hat{p}_k = \log(1 - p_k)/p_k$. This is the known "maximum" a-posteriori (MAP) algorithm, which includes an estimated value for $p_k$. This algorithm, here designated as soft deciding MAP(SDMAP) algorithm differs from the Viterbi algorithm and is more complex. The first solution is not a subject of the present method, it is only used as a reference.

The second solution is the SDV algorithm, of which it is required that it supplies the same hard decisions as the Viterbi algorithm, which are only ML for the sequence and not MAP for the symbols. Therefore the original Viterbi algorithm is used and is expanded by an error probability evaluation device which in the end provides the value $\hat{u}_k \log(1 - \hat{p}_k)/\hat{p}_k$ for each bit $u_k$ as the soft decision value. In this connection the additional complexity should be kept as small as possible. Furthermore, soft decisions should be provided at the same time k at which the decision of $u_k$ is available in order to avoid further delays.

Regarding the receiver, for simplicity's sake there is a limitation to trellis diagrams with two branches ending at each node point. For trellis diagrams with more than two paths per state, in an optimal way it is required to compare the survivor path with each other path in succession. This reduces the search to the binary case and the method takes place as described. A more economical method consists in comparing the survivor path only with the p next-best paths, in the extreme case only with the second best path, where p then equals 1.

In a conventional convolutional code of the rate 1/N, exactly N channel bits are transferred for each arriving information bit; if not all information bits are transferred, but suitable channel bits are erased or "punctured", the result is a code with the rate K/N. The code rate can thus be increased. The advantage of the punctured codes lies in that the trellis diagram remains the same in principle, in particular the number of paths remains unchanged. This does not change the coding effort. This includes punctured codes of the rate K/N deriving from a code of the rate 1/N, because they use the net diagram of the code with the rate 1/N.

The number of the states S of the decoder is $S = 2\nu$, where $\nu$ is the code memory; however, decoders with a reduced number of states are also possible.

Figure 2:
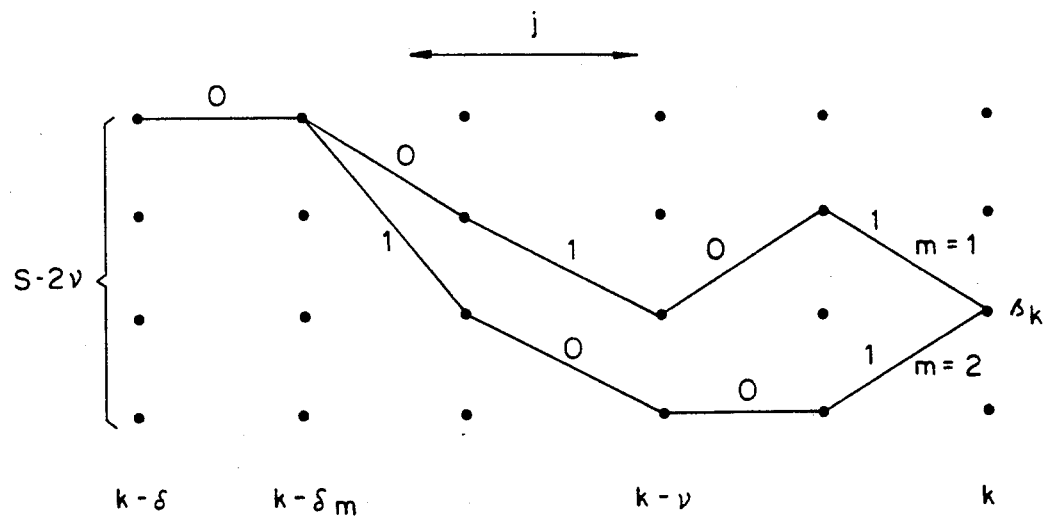
FIG. 2 is an example of a Viterbi algorithm with analog value decisions (SDVA)

The classic Viterbi algorithm makes a final decision with a delay $\delta$, where $\nu$ is sufficiently large so that all $2\nu$-survivor paths have joined with a sufficiently large probability. As shown in FIG. 2, the Viterbi algorithm has one survivor path each for the state $s_k$ at the time k, where $1 \leq s_k \leq S = 2\nu$. This is accomplished by selecting the path with the maximal probability metric, which for the Gaussian channel is the logarithm of the Gaussian probability density, $$M_m = -\frac{E_s}{N_0} \sum_{j=k-\delta}^{k} \sum_{n=1}^{N} (y_{jn} - x_{jn}^{(m)})^2, \, m = 1, 2, \quad (4)$$

where $x^{(m)}_{jn}$ is the n-th bit of N bits in the branch for the m-th path at the time j, $Y_{jn}$ is the received value at the same position, and $E_s/N_0$ is the signal-to-noise ratio (SNR). By means of this formula the result is $$\text{Prob\{path 1\}} \sim e^{M_1} \quad (5)$$
$$\text{Prob\{path 2\}} \sim e^{M_2},$$

if the path with the higher metric is designated as $m = 1$. Then this means $M_1 \leq m_2$, which in turn includes that the Viterbi algorithms selects the path 1. The probability that the wrong survivor path will be selected then is:

$$p_{sk} = \frac{e^{M_2}}{e^{M_1} + e^{M_2}} = \frac{1}{1 + e^{M_1 - M_2}} = \frac{1}{1 + e^\Delta}, \quad (6)$$

$$\Delta = M_1 - M_2 \geq 0.$$

The value of $p_{sk}$ is 0.5, if $M_1 \approx M_2$, and approaches 0, if $M_1 > M_2$. With this probability $p_{sk}$ the Viterbi algorithm has made errors at all the e-positions where the information bits of path 2 differ from path 1. By e-position that number of positions is indicated where the information bits of the two investigated paths differ from one another. For example, in FIG. 2 the information bits differ in the interval from $k-4$ to $k-3$ and in the interval from $k-3$ to $k-2$. In all other time periods the bits are equal in pairs. Thus, in this example $e=2$.

$$u_j^{(1)} \neq u_j^{(2)}, j = j_1, \ldots, j_e \quad (7)$$

Positions where $u_j^{(1)} = u_j^{(2)}$ are not affected. Let the value $\delta_m$ be the length of these two paths until they meet. The result then is $e$ different information values and $(\epsilon_m - e)$ non-different values. If then the probabilities $p_j$ of prior erroneous decisions at the path 1 have been stored, then these probabilities for the $e$ differing decisions on this path will be updated corresponding to $$P_j = P_j(1 - p_{ek}) + (1 - p_j)p_{ek}, j = j_1, \ldots, j_e, 0 \leq p_j \leq 0.5 \quad (8)$$

To do this, the information bits of the two paths must be compared with each other to determine the places where they differ. However, in this connection it should be noted that the first $\nu$ bits are equal, because the two paths end in the same bit state. An indicator $\delta_p$ can be stored for all states to show the maximal length of paths that have not merged and to search only from $j = k - \nu$ to $j = k - \delta_p$. Also, the recursion could be performed directly in accordance with the ratio of probability:

$$L_k = \log \frac{1 - p_k}{p_k} \quad 0 \leq L_k < \infty. \quad (9)$$

By means of equations (6), (8) and (9) and after appropriate conversion, the following is the result:

$$L_j = f(L_j, \Delta) \quad (10)$$

$$f(L_j, \Delta) = \frac{1}{\alpha} \log \frac{1 + e^{(\alpha L_j + \Delta)}}{e^{\Delta} + e^{\alpha L_j}},$$

$$\Delta = M_1 - M_2 \geq 0, j = j_1, \ldots, j_e.$$

The function $f(L_j, \Delta)$ should be tabulated with $L_j$, and $\Delta$ as input variables and need not be calculated for each step. The factor $\alpha$ prevents overflow in case of a large signal-to-noise ratio. The factor $\alpha$ is correctly chosen as $$\alpha = 4d_{free} \frac{E_s}{N_0}, \quad (11)$$

where $d_{free}$ is the free distance of the code. The function can also be approximated by $$f(L_j, \Delta) = \min (L_j, \Delta/\alpha). \quad (11a)$$

It is now possible to formulate the soft deciding Viterbi (SDV) algorithm:

Storage:

| | | |
|---|---|---|
| k | | (time index, modulo $\delta + 1$) |
| $\hat{u}(s_k) = \{\hat{u}_{k-\delta}(s_k), \ldots, \hat{u}_k(s_k)\},$ | $1 \leq s_k \leq S$ | (hard decision values, $\hat{u} \in \{\pm 1\}$) |
| $\hat{L}(s_k) = \{\hat{L}_{k-\delta}(s_k), \ldots, \hat{L}_k(s_k)\},$ | $1 \leq s_k \leq S$ | (reliability values, soft decisions, $0 \leq \hat{L} \leq \infty$) |
| $\Gamma(s_k),$ | $1 \leq s_k \leq S$ | (accumulated metric values = survivor cost) |

Initialization:
| | |
|---|---|
| $\hat{u}(s_k) = 0,$ | $1 \leq s_k \leq S$ |
| $\hat{L}(s_k) = +\infty,$ | $1 \leq s_k \leq S$ (*) |

-continued

| | |
|---|---|
| $\Gamma(s_0) = 0, \Gamma(i) = +\infty,$ | $i \neq s_0.$ |

Recursion:
a) Classical Viterbi step:
For each state $s_k$
  Compute $$\Gamma(s_{k-1}, s_k) = \Gamma(s_{k-1}) + \frac{E_1}{N_0} \sum_{n=1}^{N} (y_{kn} - x_{kn}^{(m)})^2$$

for both transitions $(s_{k-1}, s_k)$.
  Find $\Gamma(s_k) = \min \Gamma(s_{k-1}, s_k)$.
  Store $\Gamma(s_k)$ and the corresponding survivor $\hat{u}_k(s_k)$.

b) Soft-deciding update: (*)
For each state $s_k$
  Compute $\Delta = \max \Gamma(s_{k-1}, s_k) - \min \Gamma(s_{k-1}, s_k)$.
  Initialize $\hat{L}_k(s_k) = +\infty$.
    For $j = k - \nu$ to $j = k - \delta_m$
      Compare the two pathes merging in $s_k$
      if $\hat{u}_j^{(1)}(s_j) \neq \hat{u}_j^{(2)}(s_j)$ then update
        $L_j := f(L_j, \Delta)$ c) Final decision:
Find state $s_{k\ opt}$ with min $\Gamma(s_k)$.
The hard decision is $\hat{u}_{k-\delta}(s_{k\ opt}) \in \{\pm 1\}$.
The soft decision is $\hat{u}_{k-\delta}(s_{k\ opt}) \cdot \hat{L}_{k-\delta}(s_{k\ opt}) \in R.$ (*)

d) Set k to $k + 1 \mid_{mod\ \delta + 1}$ and repeat.

The classical Viterbi algorithm in accordance with the invention has only been augmented by the steps marked by (*). For improved definition of the algorithm the hard and soft decision values are stored in two different fields of the length $\delta + 1$ (see FIG. 4). In this connection the hard decision values can be considered to be the signs of the soft decision values. Storage is performed modulo $\delta + 1$ in order to allow messages of optional length. Of course it is also possible to make the final decision first and then the free position can be overwritten with the actual values. This means a modulo $\delta$ operation and leads to a reduction in respect to the memory size. Initialization with $+\infty$ indicates the highest possible value.

Additive metrics have the property that a multiplication or addition not depending on y does not change the decision. This makes it possible to update $$\Gamma(s_{k-1}, s_k) = \Gamma(s_k) - 2 \frac{E_s}{N_0} \sum_{n=1}^{N} y_{kn} \cdot x_{kn}^{(m)}. \quad (12)$$

Since it is true that $x_{kn} \in \{+1\}$, a real value multiplication can be avoided. Furthermore, it is possible to drop the factor $2 E_s/N_0$ and to account for this term in the calculation of $\Delta$ either by multiplication or expansion of the actual table to the form $f(L_k, \Delta, E_s/N_0)$. A signal-to-noise ratio must be calculated with the help of known methods. However, a poor guess has only a negligible effect on the performance and does not affect the sign of the decisions.

In place of the optimal procedure as described above, two modified solutions requiring less effort are offered:

1. The state with the most advantageous metric is determined and only the ML path is updated. This results in a reduction of the soft updating by a factor of S.

2. The search generally is only performed in the range where $j = k - \nu$ to $j = k - \delta'$, with $\delta' < \delta_m \leq \delta$. In connection with 2. it must be emphasized that the information bits in the interval $k - (\nu + 1)$ to $k - \nu$ always differ. Therefore a solution would be to put $\delta' = \nu + 1$. This special case is interesting because a "search" need not be performed and because the so-called "update" value is replaced by a one-time operation. It is possible to write $\Delta = M_1 - M_2$ directly as reliable value to the associated memory position of the path surviving each state. Initialization is therefore useless. Finally, it should be noted that the classical Viterbi recursion can be nonstandardized with the help of the standard solutions. The latest soft deciding values, with the exception of the value $\alpha$, do not require further nonstandardization.

Technical Realization

Figure 4:
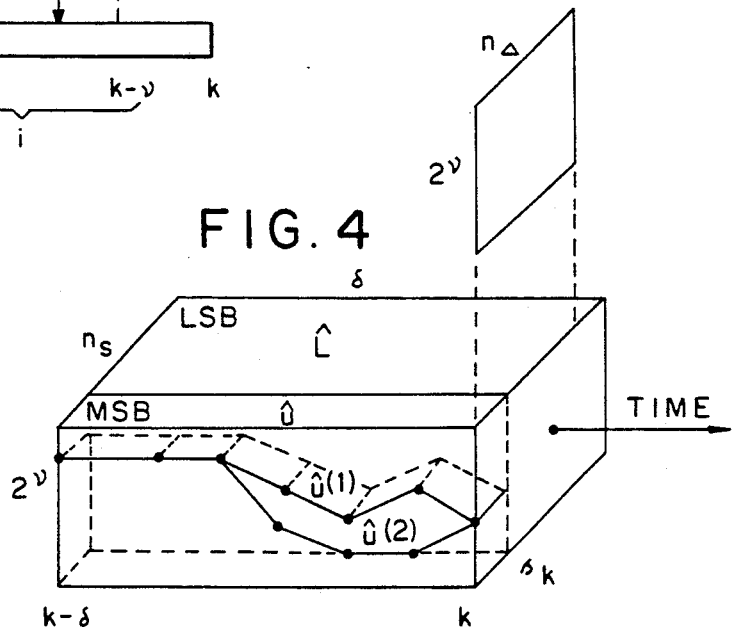
FIG. 4 is a block diagram of a path RAM and a metric RAM.
Figure 6:
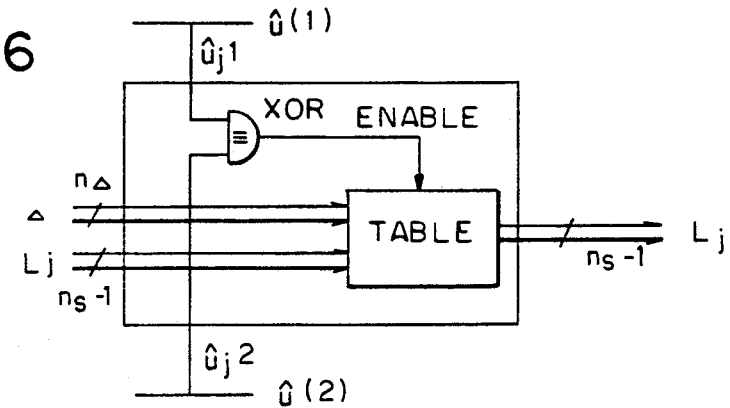
FIG. 6 is a schematic view of a path updating unit (PAU) in accordance with the invention.

As schematically indicated in FIG. 4, with an $n_s$ soft bit decision and fixed point arithmetic, each survivor path of the length $\delta$ comprises $n_s \cdot \delta$ bits. The first one of the $n_s$ bits is the sign bit or the hard decision bit. The probability values then are $L_k \in \{0.1 \ldots, 2^{n_s-1}-1\}$. $L_k=0$ indicates the most unreliable value and $L_k = 2^{n_s-1}-1$ indicates the most reliable value. If the metric difference $\Delta$ is given, which has been quantized with $n_\Delta$ bits, the updated probability value is shown in the table illustrated in FIG. 6. The table is calculated only once with the aid of equation (10) and is then stored in the ROM memory. Accordingly, the additional effort of the soft deciding Viterbi (SDV) algorithm in comparison to the Viterbi algorithm is:

Storage:
  $2^\nu \cdot \delta \cdot n_s$ bits instead of $2^\nu \cdot \delta$ bits
  Reference table with $2^{n_\Delta + n_s - 1}$ vectors with $n_s - 1$ bits each.

Computation Effort:
  Maximally $2^\nu \cdot (\delta - \nu)$ bit comparisons
  $2^\nu \cdot e$ table references to update $L_k$
  Long-term channel estimate value for computing the signal-to-noise ratio.

The data transfer will be explained in detail below.

The value e is a random number and is dependent on the channel noise and the code structure. The following is applicable for a high signal-to-noise ratio:

$$e = \frac{\hat{c}_{dfree}}{a_{dfree}}, \quad (13)$$

where $c_{dfree}$ is the total number of bit errors in all $a_{dfree}$ paths with free distance $d_{dfree}$, nonstandardized to one information bit. For a lower signal-to-noise ratio, the value e is upwardly limited by $$\tfrac{1}{2}(\delta - \nu) \quad (14)$$

Figure 3:
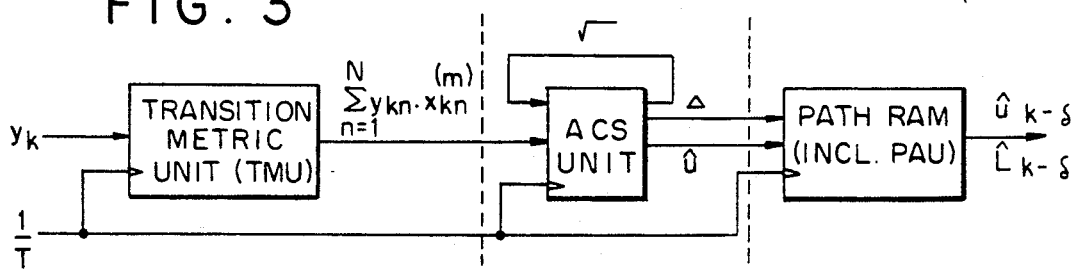
FIG. 3 is a block diagram of a Viterbi algorithm with analog value decision (SDVA) with a so-called pipelining effect.

The soft deciding Viterbi (SDV) algorithm can be performed in a "pipeline" structure (clocked at a symbol rate of 1/T) (see FIG. 3)). Accordingly, very high speed implementation is possible. The units required for this are a metric increment unit (transition metric unit (TMU)), an add-compare-select (ACS) unit and a path RAM (including a path updating unit (PAU)). There is no interaction between the ACS unit and the path memory RAM.

For each symbol $y_k$ received the TMU unit calculates the metric increments for all possible transitions. This unit is the same as the corresponding unit in a conventional Viterbi algorithm. If the (soft deciding) Viterbi algorithms operates as demodulator, decoder or equalizer, only another TMU unit need be added.

The TMU unit provides the metric increments to the ACS unit which performs the metric updating (see equation (12)). The ACS unit, too, remains unchanged in comparison with the conventional Viterbi algorithm. The ACS unit is the bottleneck in Viterbi algorithms. This units limits the speed because each recursion must be terminated before the next one can start. Further pipelining of this unit is impossible. Accordingly, for time-critical operations this unit is provided in parallel form for each state. The only modification of the ACS unit for the soft deciding Viterbi algorithm is made for calculation of $\Delta$, and is only an n-bit subtraction and for the increased data transfer between the ACS unit and the path storage unit of $(1 + n_\Delta)$ bits instead of one bit.

Finally, the data are stored in the path RAM; therefore only this memory device needs to be changed. Normally, information is decoded in every state and the information bit(s) is (are) stored in that sequence which had been the result in the previous state. Now not only the hard information bits, but also a vector of $n_s$ bits also containing the reliability information is stored.

A block diagram of a modified path RAM is shown in FIG. 4. It is arranged as a $2^\nu \cdot \delta \cdot n_s$ matrix, where $2^\nu \cdot \delta$ bits are assigned to the hard decision while the rest is reliability information.

Figure 5:
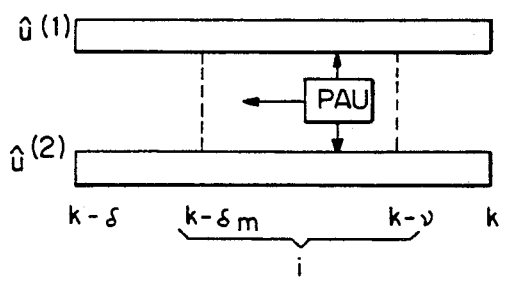
FIG. 5 is a schematic of a updating operation or an updating of an analog value decision (SD)

The soft decision updating is shown in FIG. 5. Two paths are assumed, which diverge at the time k and merge at the time $k - \delta_m$ (see FIGS. 2 and 4). A so-called path updating unit (PAU) is used and "slides" over the stored information bits. The range where the information bits $u^{(1)}$ and $u^{(2)}$ may be different is $j = k - \delta_m$ to $j = k - \nu$. In all cases where the bits are different when the table is read, updating is possible by means of equation (10). The enable signal is simply generated by means of an XOR gate (see FIG. 6).

This serial realization limits the amount of circuitry, but slows down the speed. However, the path updating unit (PAU) can also be realized in parallel form, for example in $(\delta - \nu)$ individual units per state. Then each unit only needs to compare one bit pair and to perform (at most) one table update for each symbol. If this is compared with the ACS unit, in which operations with real numbers must be performed, the ACS unit remains the bottleneck. The soft deciding Viterbi algorithm does not limit the speed.

The final decision does not differ from the conventional register exchange method; only the data transfer is greater by a factor of $n_s$.

Possible Applications of the Invention

The Viterbi algorithm with analog decisions (SDVA) according to the invention works better than a conventional Viterbi decoder, demodulator or equalizer when concatenation is provided. This may include modulations with memory, for example a trellis coded modulation (TCM), or modulation methods with a constant envelope, such as CPM (continuous phase modulation) or TFM (tamed FM), channels with memories, for example filter channels with intersymbol interference (ISI), frequency-selective channels or also storage media, such as magnetic recordings; coding with memory, for example convolutional codes, and all possible combinations of these.

Some applications of practical interest will be described below. Applicant has investigated the performance of the Viterbi algorithm with analog value decision (SDVA) of the invention and compared the results with the SD-MAP algorithm, which is the optimal symbol-by-symbol receiver. Extensive computer simulations were also performed. The results have shown that the degradation of the SDV algorithm, compared with the SD-MAP algorithm is on the order of 0.2 dB.

However, the gain compared with the hard decisions is 2 dB to 6 dB.

Concatenated coding with inner and outer convolutional codes also is very promising. With the inner codes the soft-quantized samples received are used which, in the case of channels with memory may possibly be improved by the use of channel state information. In connection with the receivers mentioned above, the outer decoder can also perform soft decision maximum likelihood decoding.

For example, the code with $R = \frac{1}{2}$ and $\nu = 3$ was used as inner code, and as outer code the punctured (perforated) code with $R = \frac{2}{3}$ and $\nu = 3$ (see Table 1). Both codes were separated by interleaving. The total code rate is $R = R_i \cdot R_0 = \frac{1}{3}$.

Because all the codes were derived from the same mother code, the trellis diagrams were the same and advantageously both the codes are correspondingly processed which utilized the same Viterbi algorithm in which the novel, soft-augmented receiver is used for the inner code and the conventional Viterbi algorithm for the outer code. A structure has already been provided in which interleaving, too, is utilized in a shared way in an efficient manner.

As a result the bit error curves are steeper and thus more promising. This holds true for the concatenation of two codes in comparison with a single convolutional code with a rate of $\frac{1}{3}$ and the same receiver complexity. The gain is 0.7 dB at $p_b = 10^{-5}$. Concatenation without the use of soft decisions is useless.

Regarding the optimal distribution between the inner and outer codes, several low-rate, rate-compatible punctured codes (RCPC codes) were used as inner codes and selected high-rate punctured codes in such a way, that the total rate $R = R_i \cdot R_0 = \frac{1}{3}$ was maintained ($R_i \leq R_0 \leq 1$). The most important parameters of the selected codes are listed in table 2 at the end of the description. Simulations have shown that in connection with low signal-to-noise ratios the outer code with the highest rate works best, as expected. However, in the SNR range of interest a distribution of $R_i = \frac{1}{2}$ and $R_0 = \frac{2}{3}$ is the best.

In connection with convolutional codes, too, there is a possibility of soft code decoding in an optimal and elegant way. There are also simple block codes which can be decoded by means of soft decisions. Such codes are, for example, parity check codes or Golay codes. Such codes can be placed after the SDV algorithm and as step decoding they result in considerable improvement.

A possible use of this combination of convolutional codes is in the channel coding in the GSM system. In this case coding (at full rate speed) is usually done as follows:

A block of 260 net speech bits is grouped into three classes of sensitivity or sensibility. The 50 bits of the most sensitive class (class 1a) are increased by three parity bits in order to detect incorrigible errors. With one error usually the entire block is ignored and interpolation takes place. A "partial soft decision Viterbi algorithm" with parity check is now assumed, which supplies soft decisions only with the bits of class 1a and hard decision for the remaining bits of class 1b. It is then possible to perform a soft decision parity check which corrects additional errors, if required.

Alternately, in case errors were detected by means of the parity check, it is possible to perform maximum ratio combining with the "soft" value $m_{k-1}^{(-1)}$ of the previous block:

$$x_k := (x_k + x_{k-1})/2$$

If necessary, this can also be improved by channel state information $q_k$:

$$x_k = (q_k x_k + q_{k-1} x_{k-1})/2$$

This results in a "soft" combination instead of a "hard" interpolation. Coded modulation has created great interest in recent years. The reason for this is bandwidth efficiency. In contrast to this, convolutional codes result in bandwidth extension which is proportional to the code rate if the number of elements of the symbol space remains unchanged.

In this connection the efficiency of the Ungerboeck code with four states and a rate of $\frac{2}{3}$ was investigated. The signal may be considered to be corrupted by white Gaussian noise and is processed by means of the soft coding Viterbi algorithm. The modified Gaussian probability metric then reads (compared with equation (4)) as follows:

$$M_m = -\frac{E_s}{N_0} \sum_k |y_k - x_k^{(m)}|^2, \quad (15)$$

where $x_k^{(m)}$ is the complex symbol of the m-th path corresponding to the trellis diagram, and $y_k$ is the complex value received at the same time k, where $x_k^m$ and $y_k$ are written in complex notation. In the result the signal-to-noise ratio (SNR) of the soft decoding Viterbi algorithm is much better than at the input (normally by more than 3 dB). A decoder in the next stage operates much better with this improved signal-to-noise ratio (SNR).

Equalization offers a challenge with fast digital transmissions via time-dispersive channels, for example mobile radio channels. In this connection the Viterbi equalizer performs the desired maximum-likelihood sequence estimation. However, the difficulty in coded systems of the Viterbi equalizer supplying hard decisions to the outer decoder becomes obvious.

Therefore the SDV algorithm and the SD-MAP algorithm were investigated in connection with frequency-selective fading channels. For the channel a delay line with taps having (L+1) independent tap gaseous was assumed. This channel, which represents an idealization of the mobile multipath channel, can be considered to be the inner code. The modified Gaussian probability metric then reads (in comparison with equation (4)) as follows:

$$M_m = -\frac{\hat{E}_s}{N_0} \sum_k \left| y_k - \sum_{l=0}^{L} f_k^{(l)} x_{k-1}^{(m)} \right|^2, \quad (16)$$

where $x_k^{(m)}$ is the symbol for the m-th path corresponding to the trellis diagram, $f_k^{(1)}$ is the l-th amplification factor, where $0 \leq 1 \leq L$, $y_k$ is the received value at the same time k, and where $x_k^{(m)}$, $y_k$ and $f_k^{(1)}$ appear in complex notation. The value $E_s/N_0$ is the mean signal-to-noise ratio value. It was shown that the output variable of the SDV algorithm and the SDMAP algorithm almost have a Gaussian distribution, at least in the signal-to-noise ratio range of interest. This indicates that the frequency-selective fading channel is transformed into an AWGN channel if the spread is sufficiently large. A convolutional code of the rate ½ with a memory $\nu=3$ was selected as outer code (see Table 1). With the SDV algorithm and the SDMAP algorithm each at $p_b=10^{-3}$, the gain is in the range of 4 dB, compared with the hard decisions. Similar results were derived for trellis codes as outer codes. As expected, the worse the channel, the larger the gain because of soft decisions. For this reason, a soft deciding Viterbi algorithm according to the invention can be used in a particularly advantageous manner especially in connection with fading channels.

TABLE 1

| Code Parameters for Convolutional Codes | | | |
|---|---|---|---|
| Code | i | $d_i$ | $\hat{c}_{di}$ |
| R = 1/3 | 0 | 10 | 6 |
| | 1 | 11 | 0 |
| | 2 | 12 | 6 |
| | 3 | 13 | 0 |
| | 4 | 14 | 58 |
| R = 1/2 | 0 | 6 | 2 |
| | 1 | 7 | 7 |
| | 2 | 8 | 18 |
| | 3 | 9 | 49 |
| | 4 | 10 | 130 |
| R = 2/3 | 0 | 4 | 5 |
| | 1 | 5 | 21.5 |
| | 2 | 6 | 100 |
| | 3 | 7 | 413 |
| | 4 | 8 | 1657 |

R = 1/3, R = 1/2: mother codes
R = 2/3: punctured code (see Yasuda 1984)
memory: $\nu = 3$
generator polynoms: 15, 17, 13 (in octal)
$d_i$: distance spectrum
$\hat{c}_{di}$: information weight spectrum (normalized $c_{di}$ per each information bit)

TABLE 2

| Code Parameters for Punctured Convolutional Codes | | | | | |
|---|---|---|---|---|---|
| inner code | | | outer code | | |
| R | $d_{free}$ | $\hat{c}_{dfree}$ | R | $d_{free}$ | $\hat{c}_{dfree}$ |
| 1/2 | 6 | 2 | 2/3 | 4 | 5 |
| 4/9 | 6 | 0.5 | 3/4 | 4 | 41.3 |
| 2/5 | 7 | 1 | 5/6 | 3 | 12.6 |
| 8/21 | 7 | 0.25 | 7/8 | 2 | 0.6 | inner codes: punctured codes (see Hagenauer 1988)
outer codes: punctured codes (see Yasuda 1984)
memory: $\nu = 3$
generator polynoms: 15, 17, 13 (in octal)
$d_{free}$: distance spectrum
$\hat{c}_{dfree}$: normalized nr. of bit errors of the minimum-distance path (per each information bit)

We claim:

1. A method for generalizing a conventional Viterbi algorithm in which transition costs are formed in a transition metric unit (TMU) and adding, comparing and selection are performed in a succeeding add-compare-select unit (ACS), comprising the steps of
    calculating different costs from two arriving paths for each individual state;
    setting a reliability information at the beginning of each path at a highest value;
    updating a reliability value of the path with least costs where information points differ from a competing path by performing said updating in accordance with a table;
    feeding a prior value of the reliability information and difference costs ( $\wedge$ ) into the table as input values;
    taking the said input values from the table and storing said values along with hard decisions, as path memory, in the form of fixed or floating point values;
    reading out an analog value decision from a point which, after a defined decision delay ($\delta$) is the result for the path with the lowest cost;
    said hard decisions of the conventional Viterbi algorithm being signs of an analog value decision.

2. The method for modifying the Viterbi algorithm in accordance with claim 1 further comprising
    forming normalized path difference costs ($\Delta/\alpha$) for updating the reliability information from a minimum from an old reliability information including introducing a factor ($\alpha$);
    and storing a new value so derived as path memory.

3. The method for modifying the Viterbi algorithm in accordance with claim 1 further comprising
    checking information bits of two competing paths for concurrence within a defined area ($k-v$ to $k-\delta_p$ with $v \leq \delta_p \leq \delta_m$) to accomplish path updating with a path updating unit (PAU);
    and activating an updating procedure if a non-concurrence is noted
    where k identifies a time index, v, a code memory and $\delta$, a decision delay.

4. A device for generalizing a conventional Viterbi algorithm comprising
    a metric increment unit (TMU) in which costs are formed;
    an add-compare-select unit (ACS) in which addition, comparison and selection are performed;
    two competing paths;
    a path RAM and a path updating unit (PAU) placed after said add-compare-select unit (ACS) and after said two competing paths to check information bits of said two competing paths in time interval $k-v$ to $k-\delta_m$ for concurrence, and in case of non-concurrence to activate the updating process in the path RAM.

5. The device in accordance with claim 4 further comprising
    a means for normalizing the updating of reliability information by introducing a factor $\alpha$ to satisfy a fixed point representation and to avoid overflow.

6. The device in accordance with claim 4 further comprising
    a parallel arrangement of each said path updating unit (PAU) for each S state provided so that on the basis of parallel arrangement in view of providing only a single path updating unit (PAU), a gain in time of the value of a factor S is achieved.

7. The device in accordance with claim 4 further comprising
    a separate said path updating unit (PAU) for each time interval $k-v$ to $k-\delta_p$ providing a parallel arrangement so that because of said parallel arrangement gains of the value of a factor ($v-\delta_p$) are attained.

* * * * *